United States Patent [19]

Yoshikawa et al.

[11] Patent Number: 5,103,766
[45] Date of Patent: Apr. 14, 1992

[54] VACUUM ARC VAPOR DEPOSITION DEVICE HAVING ELECTRODE SWITCHING MEANS

[75] Inventors: Tetsuya Yoshikawa, Kobe; Hakumi Hasegawa, Miki, both of Japan

[73] Assignee: Kabushiki Kaisha Kobe Seiko Sho, Kobe, Japan

[21] Appl. No.: 540,124

[22] Filed: Jun. 19, 1990

[51] Int. Cl.$^5$ ............... C23C 14/00; C23C 14/22
[52] U.S. Cl. .................... 118/723; 427/37; 219/121.15; 219/121.21; 219/121.34; 219/121.35
[58] Field of Search ............ 427/37; 118/723; 219/121.11, 121.15, 121.21, 121.33, 121.34, 121.35

[56] References Cited

U.S. PATENT DOCUMENTS 3,793,179 2/1974 Sablev et al. ............... 204/298
3,836,451 12/1975 Snaper ..................... 204/298
4,828,934 5/1989 Pinkhasov ................. 427/37

Primary Examiner—Shrive Beck
Assistant Examiner—Margaret Burke
Attorney, Agent, or Firm—Oblon, Spivak, McClelland, Maier & Neustadt

[57] ABSTRACT

A vacuum arc deposition device having electrode switching means comprising two or more electrodes consisting of vacuum arc vapor evaporation source materials and a substrate to which films are formed by means of vacuum arc vapor deposition, each of the electrodes and the substrate being contained in a vacuum chamber capable of introducing a reactive gas, wherein the electrodes are connected to arc discharging DC power supplies by way of polarity switching means so that each of the electrodes functions as a cathode and an anode alternately. Films, in particular, of insulative property can stably be vapor deposited on a substrate for a long period of time continuously.

2 Claims, 3 Drawing Sheets

VACUUM ARC VAPOR DEPOSITION DEVICE HAVING ELECTRODE SWITCHING MEANS

BACKGROUND OF THE INVENTION

1. Field of the Invention

The present invention concerns a vacuum arc vapor deposition device for forming thin films on a substrate by means of vacuum arc vapor deposition belonging to physical vapor deposition (PVD) and, more in particular, it relates to device of reactive arc ion plating capable of forming a thin insulative film.

2. Description of the Prior Art

The vacuum arc vapor deposition process and apparatus in the prior art are disclosed in, for example, Japanese Patent Publication Sho 58-3033. FIG. 6 shows a typical embodiment of the apparatus in which the inside of a vacuum chamber (a) is evacuated to a degree of lower than $10^{-3}$ Torr and vacuum arc discharging is started under the evacuated state between a cathode (c) connected to the negative pole of an arc power supply (b) and an anode (d) disposed at the periphery thereof and connected to the positive pole of the power supply by a spark supply device (e), etc. by which arc spots move around at a high speed on the evaporation surface of the evaporation source metal such as Ti on the cathode, thereby evaporating and ionizing the evaporation source metal by the energy of arc spots and vapor depositing to form a film toward a substrate (f) in the vacuum chamber.

When a reactive gas is introduced into the vacuum chamber, reactive vacuum arc vapor deposition in which a compound with the evaporation metal is vapor deposited into a film can also be conducted.

As the anode (d), an electrode disposed so as to surround a substrate in a vacuum chamber may be connected to a positive pole of a power supply and utilized as the anode as shown in FIG. 1 of Japanese Patent Publication Sho 52-14690 in addition to the deposition at the periphery of the cathode.

In this technique, thin films of various metal compounds can be formed on a substrate by selecting the combination of the metal material as the evaporation source on the cathode and the kind of the reactive gas.

The kind of films of metal compounds to be formed on the metal substrate due to the reactive vacuum arc vapor deposition technique as described above may include those conductive material such as TiN, ZrN, HfN, TiC, Ti(C,N), CrN and CrC, as well as insulative materials such as AlN or oxide, for example $TiO_2$, $ZrO_2$, $HfO_2$, $V_2O_5$, $Al_2O_3$ and mixed oxide, for example, $(Ti, Zr)O_2$.

In the case of forming such insulative films by the device in the prior art, the insulative films are gradually deposited not only to the surface of the substrate but also to the surface of the anode to hinder the electro-conduction in the anode surface, making it impossible to maintain the arc discharge. Accordingly, there has been a drawback in the prior art that the insulative film can not be formed stably.

OBJECT OF THE INVENTION

An object of the present invention is to provide a vacuum arc vapor deposition device capable of forming thin films, in particular, insulative thin films stably on a substrate for a long period of time.

SUMMARY OF THE INVENTION

The foregoing object of the present invention can be attained by a vacuum arc deposition device having electrode switching means comprising two or more electrodes consisting of vacuum arc vapor evaporation source materials and a substrate to which films are formed by means of vacuum arc vapor deposition, each of the electrodes and the substrate being contained in a vacuum chamber capable of introducing a reactive gas, wherein the electrodes are connected to an arc discharging DC power supply by way of a polarity switching means so that each of the electrodes functions as a cathode and an anode alternately.

In the present invention, an electrode used as the anode has the same structure as that of the electrode used as the cathode and has an evaporation surface for evaporation source metal, that is, an arc target.

That is, there is no constitutional difference between the two electrodes due to their polarity. The electrode connected to the positive pole of the arc discharging DC power supply is used as the anode and then switched over to the negative pole of the power supply after a predetermined period of time when the arc discharge can no longer be maintained because of the deposition of insulative films. Then, the deposited films are evaporated and removed by the arc spots formed on the cathode surface. In this constitution, the two electrodes are connected to the arc discharging DC power supply by way of the polarity switching means and used as the cathode and the anode alternately by optionally switching the polarity of them so that electric discharge can be started again using the electrode acting formerly as the cathode now as the anode and vice versa.

In the case of forming insulative films on the substrate by using the reactive vacuum arc vapor deposition technique, there is a certain period of time until the insulative films is deposited to the surface of the anode making it no longer possible to maintain the arc discharge. During this period, since arc spots run about at random on the surface of the cathode to evaporate the evaporation source metal at the surface, no substantial deposition of the insulative films occur and the electro-conductive surface of the evaporation source metal is always exposed to the vacuum chamber.

In the case of forming insulative films on the substrate by using the device according to the present invention based on such a feature, if the cathode and the anode are switched regarding their functions before the maintenance of the arc discharge becomes difficult, the surface of the electrode now switched as an anode has electro-conductivity, while the surface of the electrode now switched to the cathode also recovers its electroconductive since the deposited insulative films are evaporated by the random movement of the arc spots due to the arc discharge and the evaporation source metal surface is exposed. Accordingly, it is possible to continue the stable formation of the insulative films on the substrate by stable continuation of the arc discharge during a certain period of time after the switching of the polarity after the start of electric supply. By repeating such procedures, insulative films can be formed stably for a long period of time.

DESCRIPTION OF THE ACCOMPANYING DRAWINGS

DESCRIPTION OF THE PREFERRED EMBODIMENTS OF THE INVENTION

The present invention will be explained more in detail by way of its respective embodiments shown in FIGS. 1–5.

Figure 1:
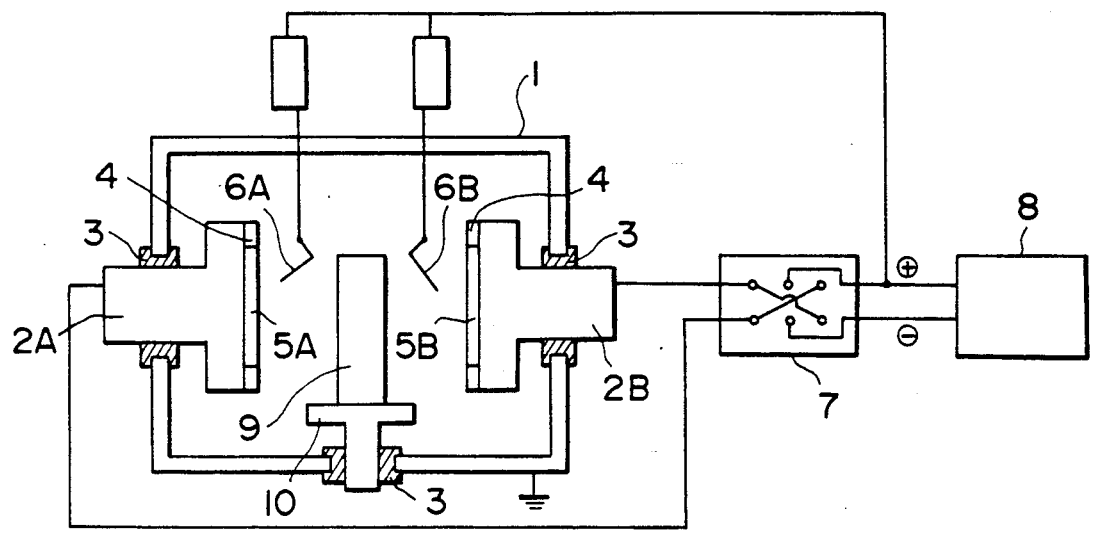
FIG. 1 is a vertical cross sectional view of a device as a fundamental embodiment according to the present invention together with electrical connection therein.

FIG. 1 shows a most fundamental embodiment according to the present invention.

In this vacuum arc vapor deposition device, the inside of a vacuum chamber 1 is evacuated by means of an evacuating device (not illustrated) to such a reduced pressure as being capable of stably maintaining vacuum arc discharging. Further, a reactive gas can be introduced by way of reactive gas supply means (not illustrated). The vacuum chamber 1 is grounded to the earth.

Two electrodes 2A, 2B are opposed in the vacuum chamber 1 and they are mounted by means of insulator seals 3 respectively to the grounded vacuum chamber 1. The electrodes 2A, 2B have structures identical to each other and have evaporation surfaces comprising targets 5A, 5B of evaporation source metals surrounded with arc confining means 4, respectively, at their opposing surfaces and, further, have arc discharge starting means 6A, 6B respectively.

The electrodes 2A, 2B are connected to the positive and negative electrodes of an arc discharging DC power supply 8 by means of a polarity switching means 7 such as a change-over switch, so that they are switched to an anode and a cathode alternatively.

A substrate 9 as a product to be processed is disposed on a rotatable table 10 at an intermediate position between both of the electrodes 2A, 2B. The table 10 penetrates the vacuum chamber 1 while keeping a vacuum seal and is insulated therefrom by means of the insulator 3. A bias voltage (for instance at RF) can be applied by way of the table 10 to the substrate 9. The bias voltage need not necessarily be applied to the substrate 9. Accordingly, the substrate may be made of insulative material as well as electroconductive metal material.

In the present invention, electroconductive films can also be formed although the object of the invention is to enable stable formation of insulative films. In this embodiment, arc discharging may be started by using an arc discharge starting means 6A from the cathode while using one electrode 2A as the cathode and the other electrode 2B as the anode.

Upon forming insulative films, for example, AlN films according to the present invention, Al is used for the targets 5A, 5B and $N_2$ gas is introduced into the vacuum chamber 1 and film formation is started by conducting arc discharging from the cathode while using one of the electrodes, for example, the electrode 2A as the cathode and the other electrode 2B as the anode in the connection to the power supply. Then, insulative AlN films are deposited with elapse of time to the surface of the electrode 2B used as the anode to increase the arc discharging voltage, making it difficult to maintain the arc discharge. In this instance, a fresh Al surface is always exposed to the target surface of the electrode 2A used as the cathode by the cleaning effect of the arc spots and AlN films are scarcely deposited thereon. Then, after a predetermined period of time has elapsed from the start of the arc discharging, the polarity is switched between the electrodes 2A and 2B by the polarity switching means to connect the electrode 2A to the positive pole and the electrode 2B to the negative pole of the power supply and the arc discharge starting means 6B is actuated. Then, arc discharging to the electrode 2B is started again easily, by which the insulative AlN films deposited on the surface of the target 5B of the electrode 2B are easily removed, by which the AlN films are continuously deposited stably on the substrate 9 and deposition of AlN occurs to the electrode 2A.

Figure 2:
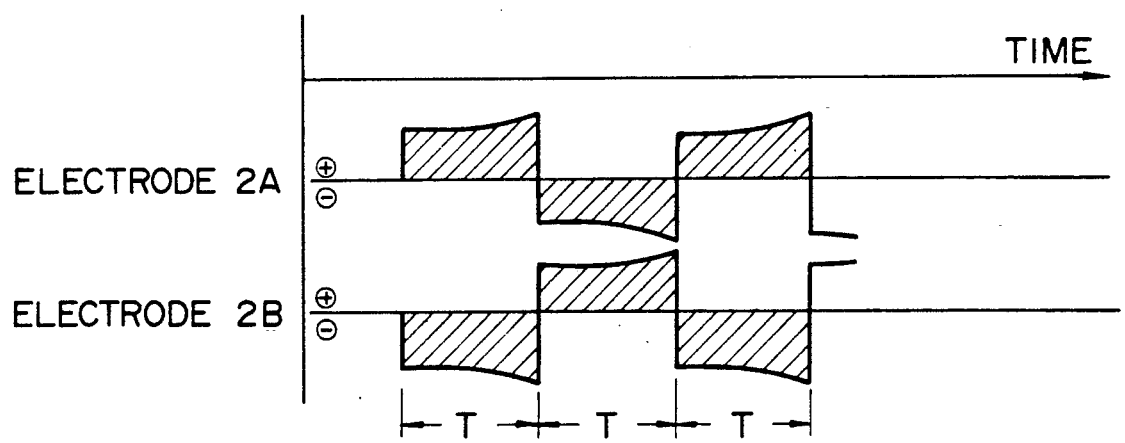
FIG. 2 is a time chart illustrating the switching process.

By repeating the switching operation for the polarity of the electrodes 2A, 2B at a predetermined time interval, stable formation of the insulative films for a long period of time, which has been impossible in the prior art, can be conducted stably in the present invention. FIG. 2 shows the step of polarity switching for the electrodes 2A, 2B while taking time on the abscissa and the voltage on the ordinate.

The time interval T between the switching points for the polarity of the electrodes differs depending on the kind of the films, film forming conditions, etc. and it is suitably within a range from 1/10 sec to several min in the case of the AlN films.

Figure 3:
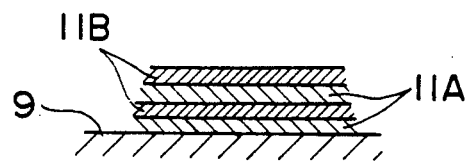
FIG. 3 is a cross sectional view of a multi-layered film formed.

In the device according to the present invention, the material for the targets attached to a plurality of electrodes are not necessarily to be identical but by using, for example, Ti for the target 5A, Zr for the target 5B and oxygen as the reactive gas, a multi-layered film having insulative $TiO_2$ films 11A and $ZrO_2$ films 11B formed alternately on the substrate 9 can be formed as shown in FIG. 3.

Further, the present invention is not restricted only to the embodiment shown in FIG. 1 in which a pair of two electrodes are switched alternately into opposite polarities. For instance, two sets of, i.e., a total of four, electrodes may be contained each with its trigger in one vacuum chamber and an arc discharging DC power supply and a polarity switching means may be disposed to each of the sets to form films on one identical substrate. Since each of the sets can be operated independently in this embodiment, it is possible to vary the thickness for each of the films in a multi-layered film free from the restriction in view of the time for polarity switching or it may be utilized for the formation of composite films.

Figure 4:
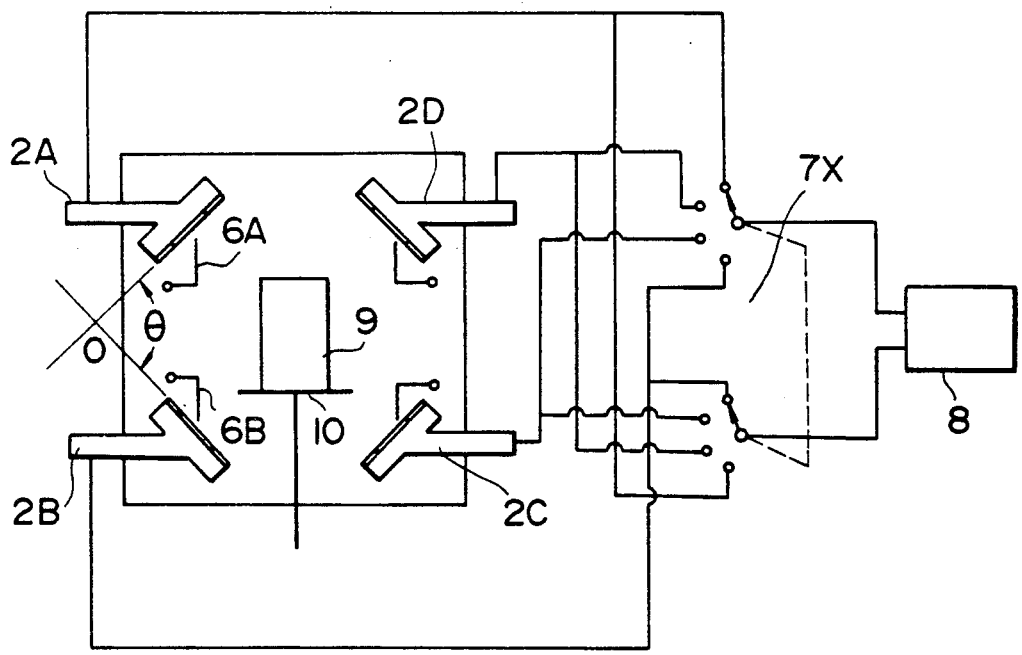
FIG. 4 is a vertical cross sectional view of a device as a modified embodiment according to the present invention together with electrical connection therein.

As a further modified embodiment, there can be considered a constitution as shown in FIG. 4, in which an arc discharge DC power supply 8 is disposed to four electrodes 2A, 2B, 2C and 2D in one chamber. In this case, by using dual rotary switches each having four contacts used for each electrode as a polarity switching means 7X, a film can be formed while using one of the four electrodes as the cathode and the others as the anode successively in rotation.

In this case, depending on the angle of disposing the electrode, the angle ($\theta$) between the electrodes constituting paired cathode and anode can vary from 0° in the case of an opposing arrangement and to 180° in the case of a parallel arrangement. Generally, as the gas pressure in the chamber is higher during arc discharging, stable discharging can be obtained even with a greater angle. Further, stable discharging tends to be attained as the distance between the cathode and the anode is closer. At a gas pressure of about 0.5 m Torr used in this experiment, it is desirable that the cathode and the anode are in an opposing arrangement and disposed as close as possible. Further, at a gas pressure of 10 m Torr, the electric discharging is stabilized more as the angle between the cathode and the anode is smaller but restriction is not so stringent. It is desirable to determine the arrangement of the electrodes taking such a tendency into consideration. The insulative films are deposited to each of the electrodes while it functions as the anode. However, since the electrode functions as the cathode during a series of polarity switching, it is removed with the insulative films and refreshed by the cleaning effect of the arc spots. Accordingly, insulative films can be formed stably on the susbstrate.

In the present invention, various polarity switching means can be adopted, for example, double-pole double-throw type, multi-stage rotary type, etc. as in the previous embodiment corresponding to the number of electrodes to be switched for the polarity that can optionally be increased. Further, motor driving, thyristor control, etc. can be adopted making the switching mode versatile and selective, as well as can conduct automatic switching operation with no timing delay and with no troubles in view of the capacity.

Figure 5:
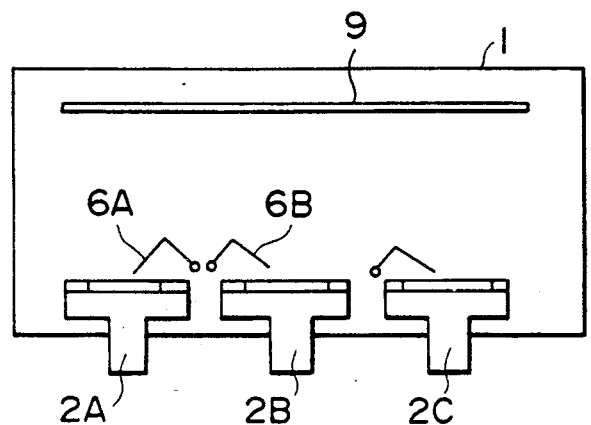
FIG. 5 is a longitudinal cross sectional view for a portion of a further embodiment according to the present invention.
Figure 6:
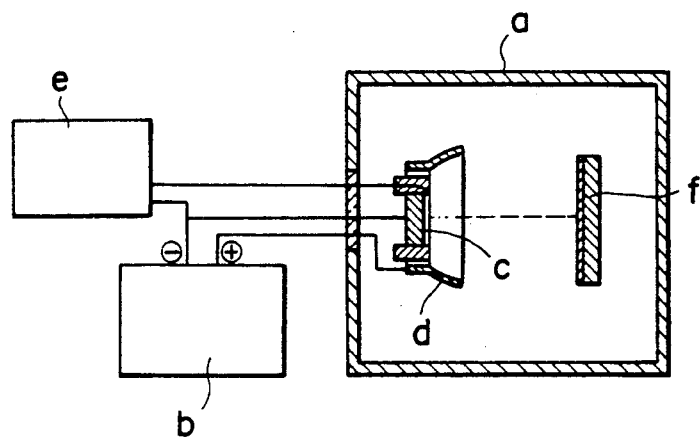
FIG. 6 is an explanatory view for the device in the prior art.

FIG. 5 shows a further modified embodiment in which three electrodes are disposed in parallel. This embodiment can be applied advantageously for utilizing the insulative property and other properties effectively by forming $TiO_2$ films on a plate-like substrate such as a glass plate.

According to the device of the present invention, single layer, multi-layer or composite films including the insulative films can be stably formed continuously on a substrate by means of vacuum arc vapor deposition.

What is claimed is:

1. A vacuum arc deposition device comprising:
  a vacuum chamber which is capable of having a reactive gas introduced therein said electrodes having the same evaporation source material formed thereon;
  two or more electrodes, located inside said vacuum chamber each comprising a vacuum arc vapor evaporation source material formed thereon;
  an arc discharging DC power supply connected to said electrodes by a polarity switching means, wherein said polarity switching means operates to reverse the polarity applied to said electrodes alternately so that each electrode functions as a cathode and anode alternately;
  arc discharge starting means positioned adjacent to each electrode inside said vacuum chamber and a substrate located inside said vacuum chamber on which films generated by said arc deposition device are formed.

2. A vacuum arc deposition device according to claim 1, wherein the vacuum arc deposition device comprises two electrodes.

* * * * *